United States Patent
Ng et al.

(10) Patent No.: US 11,179,699 B2
(45) Date of Patent: Nov. 23, 2021

(54) PHOTOCATALYTIC ASSEMBLY AND ITS PREPARATION METHOD

(71) Applicant: SOUTHERN UNIVERSITY OF SCIENCE AND TECHNOLOGY, Guangdong (CN)

(72) Inventors: Man Ching Alan Ng, Guangdong (CN); Yanling He, Guangdong (CN); Zilong Wan, Guangdong (CN); Jiahui Peng, Guangdong (CN); Yunxiang Tang, Guangdong (CN)

(73) Assignee: SOUTHERN UNIVERSITY OF SCIENCE AND TECHNOLOGY, Guangdong (CN)

( * ) Notice: Subject to any disclaimer, the term of this patent is extended or adjusted under 35 U.S.C. 154(b) by 70 days.

(21) Appl. No.: 16/085,214

(22) PCT Filed: May 17, 2017

(86) PCT No.: PCT/CN2017/084727
§ 371 (c)(1),
(2) Date: Sep. 14, 2018

(87) PCT Pub. No.: WO2018/152975
PCT Pub. Date: Aug. 30, 2018

(65) Prior Publication Data
US 2019/0083956 A1    Mar. 21, 2019

(30) Foreign Application Priority Data

Feb. 22, 2017    (CN) .......................... 201710097341.9

(51) Int. Cl.
*B01J 21/06* (2006.01)
*B01J 35/00* (2006.01)
(Continued)

(52) U.S. Cl.
CPC ............. *B01J 21/063* (2013.01); *B01J 23/38* (2013.01); *B01J 23/50* (2013.01); *B01J 35/002* (2013.01);
(Continued)

(58) Field of Classification Search
CPC . B01J 21/063; B01J 23/38; B01J 23/50; B01J 35/0006; B01J 35/0013;
(Continued)

(56) References Cited

U.S. PATENT DOCUMENTS 7,005,189 B1 * 2/2006 Tachibana ........... C03C 17/3618
428/432
2015/0307403 A1 * 10/2015 Takeuchi .............. F04B 43/046
423/598

FOREIGN PATENT DOCUMENTS

CN         1485459 A      3/2004
CN         101550546 A    10/2009
(Continued)

OTHER PUBLICATIONS

Chinese Office Action, for Chinese Counterpart Application No. 201710097341.9, dated Dec. 20, 2019 (8 pages).
(Continued)

*Primary Examiner* — James A Fiorito
(74) *Attorney, Agent, or Firm* — Kagan Binder, PLLC (57) ABSTRACT

A photocatalytic assembly (100) includes a substrate (110) and a photocatalytic unit (120) laminated on the substrate (110). The photocatalytic unit (120) includes a laminated titanium dioxide layer (122) and a metal layer (124). The titanium dioxide layer (122) has a thickness of 10 nm to 100 nm. The metal layer (124) is formed by stacking metal nanoparticles. The metal nanoparticle is made of at least one selected from the group consisting of rhodium, palladium, platinum, gold, silver, and aluminum.

5 Claims, 4 Drawing Sheets

(51) Int. Cl.
*B01J 37/02* (2006.01)
*C23C 16/455* (2006.01)
*C23C 16/02* (2006.01)
*C23C 16/06* (2006.01)
*C23C 16/40* (2006.01)
*C23C 14/14* (2006.01)
*B01J 23/50* (2006.01)
*C23C 28/00* (2006.01)
*C02F 1/72* (2006.01)
*B01J 23/38* (2006.01)
*C02F 1/32* (2006.01)
*B01J 35/02* (2006.01)

(52) U.S. Cl.
CPC ......... *B01J 35/004* (2013.01); *B01J 35/0006* (2013.01); *B01J 35/006* (2013.01); *B01J 35/0013* (2013.01); *B01J 37/0217* (2013.01); *B01J 37/0225* (2013.01); *B01J 37/0228* (2013.01); *C02F 1/725* (2013.01); *C23C 14/14* (2013.01); *C23C 16/0227* (2013.01); *C23C 16/06* (2013.01); *C23C 16/405* (2013.01); *C23C 16/45529* (2013.01); *C23C 16/45555* (2013.01); *C23C 28/00* (2013.01); *C23C 28/30* (2013.01); *C23C 28/32* (2013.01); *C23C 28/322* (2013.01); *C23C 28/34* (2013.01); *C23C 28/345* (2013.01); *B01J 35/023* (2013.01); *C02F 1/32* (2013.01); *C02F 2305/08* (2013.01); *C02F 2305/10* (2013.01)

(58) Field of Classification Search
CPC ...... B01J 35/002; B01J 35/004; B01J 35/006; B01J 37/0217; B01J 37/0225; B01J 37/0228; C02F 1/725; C23C 14/14; C23C 16/0227; C23C 16/06; C23C 16/405; C23C 16/45529; C23C 16/45555; C23C 28/00; C23C 28/30; C23C 28/32; C23C 28/322; C23C 28/34; C23C 28/345
See application file for complete search history.

(56) References Cited

FOREIGN PATENT DOCUMENTS

| | | |
|---|---|---|
| CN | 102294234 A | 12/2011 |
| CN | 102962045 A | 3/2013 |
| CN | 105908117 A | 8/2016 |
| EP | 1624087 A1 | 2/2006 |
| JP | 2004001400 A | 1/2004 |

OTHER PUBLICATIONS

Wangle et al., "Research progress of TiO2 thin film deposited by atomic layer deposition", New Chemical Materials, vol. 44, No. 9, pp. 28-32, (3 pages).

International Search Report, for International Application No. PCT/CN2017/084727, dated Nov. 22, 2017 (12 pages).

\* cited by examiner

PHOTOCATALYTIC ASSEMBLY AND ITS PREPARATION METHOD

TECHNICAL FIELD

The present disclosure relates to the field of water pollutants treatments, and more particularly relates to a photocatalytic assembly and its preparation method.

BACKGROUND

In recent years, with the increasing pollution of water resources, the research on the purification of water resources has received more and more attention, especially for the issue of the use of photocatalysis to degrade pollutants in water. Since titanium dioxide ($TiO_2$) is an environmental friendly and cheap material, and has the advantages of chemical stability, high catalytic activity, strong oxidizing ability, non-toxicity, and no secondary pollution, it is widely used as a photocatalyst and has important application value in the degradation of water pollutants.

However, the titanium dioxide commercial products currently used in photocatalysis are mostly powder materials, and the consumption of raw materials is large. In addition, due to its wide band gap (3.0 eV~3.2 eV), the activation performance can only be excited by ultraviolet light, and the photocatalytic efficiency is quite low. In order to improve the photocatalytic efficiency of titanium dioxide, many attempts have been made in the industry to reduce the width of the forbidden band of titanium dioxide and to increase the absorption of near-ultraviolet light. However, the photocatalytic efficiency cannot be effectively improved, and the photocatalytic efficiency is still low.

SUMMARY

Therefore, it is necessary to provide a photocatalytic assembly with a high photocatalytic efficiency.

A photocatalytic assembly includes a substrate and a photocatalytic unit laminated on one side of the substrate. The photocatalytic unit includes a laminated titanium dioxide layer and a metal layer. The titanium dioxide layer has a thickness of 10 nm to 100 nm. The metal layer is formed by stacking metal nanoparticles. The metal nanoparticle is made of at least one selected from the group consisting of rhodium, palladium, platinum, gold, silver, and aluminum.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

To facilitate the understanding of the present disclosure, embodiments of the invention are described more detailed hereinafter with reference to the accompanying drawings.

Figure 1:
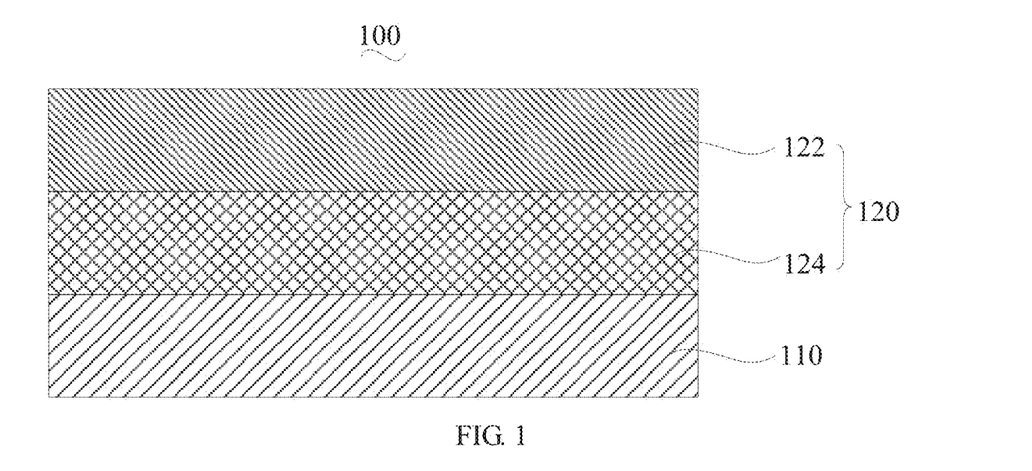
FIG. 1 is a schematic view of a photocatalytic assembly according to one embodiment.

Referring to FIG. 1, a photocatalytic assembly 100 according to one embodiment includes a substrate 110 and a photocatalytic unit 120 laminated on the substrate 110.

The substrate 110 is transparent to ultraviolet light. Specifically, the substrate 110 is made of quartz.

The photocatalytic unit 120 includes a laminated titanium dioxide layer 122 and a metal layer 124. In the illustrated embodiment, the metal layer 124 is laminated on the substrate 110, and the titanium dioxide layer 122 is laminated on the metal layer 124.

The titanium dioxide layer 122 has a thickness of 10 nm to 100 nm.

The metal layer 124 is formed by stacking metal nanoparticles, and the metal nanoparticle is made of at least one selected from the group consisting of rhodium, palladium, platinum, gold, silver, and aluminum. The metal layer 124 is obtained by thermal evaporation (i.e., vacuum evaporation).

There is a surface plasmon resonance phenomenon in the metal nanoparticle, the surface plasmon resonance absorption of the metal is related to the movement of surface free electrons, metals can be considered as free electron system, and the optical and electrical properties are determined by the electrons of conduction band. In the metal plasma theory, if the plasma is disturbed by some kind of electromagnetic to make its charge density in some areas not zero, electrostatic restoring force will be generated, such that its charge distribution will oscillate. When the frequency of the electromagnetic wave is the same as the oscillation frequency of the plasma, resonance will be occurred. Such resonance, on the macroscopic level, manifests as absorption of light by the metal nanoparticle. In addition, surface plasmon resonance of the metal is an important factor to determine the optical properties of metal nanoparticles. Due to the plasmon resonance excitation inside the metal particles or due to band absorption, the metal particles have absorption bands in the ultraviolet-visible region, and different metal particles have their characteristic absorption spectra. Since the aforementioned metal layer 124 is in the form of metal nanoparticles rather than in the form of a thin film, the thickness of the metal layer 124 does not affect the photocatalytic action of the titanium dioxide layer 122, and its the optical trapping and resonance will affect the photocatalytic action of the titanium dioxide layer 122. When the resonant wavelength is ultraviolet light, the metal layer 124 will transmit more ultraviolet light to the titanium dioxide layer 122, so as to enhance the photocatalytic action of the titanium dioxide layer 122. When the resonant wavelength is infrared light, the metal layer 124 transfers heat to the titanium dioxide layer 122 to generate hot electrons, and which can also serve to enhance the photocatalytic action of the titanium dioxide layer 122.

In addition, the metal nanoparticle has a particle size less than or equal to 150 nm. When the particle size exceeds 150 nm, no metal particles but metal films will be formed. Therefore, the effect of plasma enhancement disappears, such that the plasma enhancement cannot be achieved.

Moreover, the metal nanoparticle has the particle size of 5 nm to 50 nm. The plasma enhancement effect of the metal nanoparticles with this particle size range is the strongest.

Specifically, the metal nanoparticle has a spherical structure or a rod-like structure. The metal nanoparticle having the spherical structure is mainly the surface plasmon resonance that enhances ultraviolet light and visible light, and the metal nanoparticle having the rod-like structure is mainly the surface plasmon resonance that enhances visible light and infrared light.

In aforementioned photocatalytic assembly 100, the thickness of the titanium dioxide layer 122 is designed to be 10 nm to 100 nm, and the metal layer 124 laminated therewith is provided to be formed by stacking a plurality of the aforementioned metal nanoparticles. Due to the surface plasmon resonance phenomenon in the metal nanoparticle, such resonance phenomenon appears macroscopically as the absorption of light by the metal nanoparticle. When the resonant wavelength is ultraviolet light, the metal nanoparticle will transmit more ultraviolet light to the nanometer titanium dioxide layer 122, so as to enhance the photocatalytic action of the nanometer titanium dioxide layer 122. When the resonant wavelength is infrared light, the metal layer 124 transfers heat to the nanometer titanium dioxide layer 122 to generate hot electrons, and which can also serve to enhance the photocatalytic action of the nanometer titanium dioxide layer 122, thereby effectively enhancing the light absorption of the nanometer titanium dioxide layer 122 in the visible light region to increase the photocatalytic efficiency of the nanometer titanium dioxide layer. In addition, due to the surface plasmon resonance phenomenon on the titanium dioxide layer of the metal layer composed of metal nanoparticles stacking, the thickness of the titanium dioxide layer can be reduced to achieve nanoscale photocatalysis. Moreover, the titanium dioxide layer having an nanoscale thickness not only enables better transmission of photon-generated carriers, thereby exhibiting good catalytic performance, such that the aforementioned photocatalytic assembly 100 has higher photocatalytic efficiency; but also can save the material amount of the titanium dioxide layer and reduce the production cost.

Figure 2:
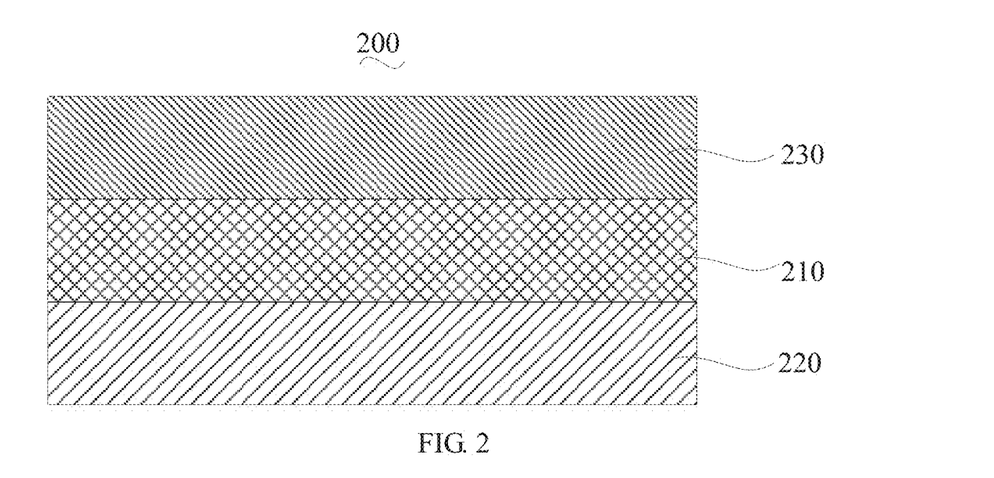
FIG. 2 is a schematic view of a photocatalytic assembly according to another embodiment.

Referring to FIG. 2, a photocatalytic assembly 200 according to another embodiment has similar structure as the photocatalytic assembly 100. The difference is that, a titanium dioxide layer 210 of the photocatalytic assembly 200 according to the illustrated embodiment is laminated on a substrate 220, and a metal layer 230 is laminated on the titanium dioxide layer 210.

Since the structure of the photocatalytic assembly 200 according to the illustrated embodiment is similar to that of the photocatalytic assembly 100, the photocatalytic assembly 200 also has the effect of the photocatalytic assembly 100.

Figure 3:
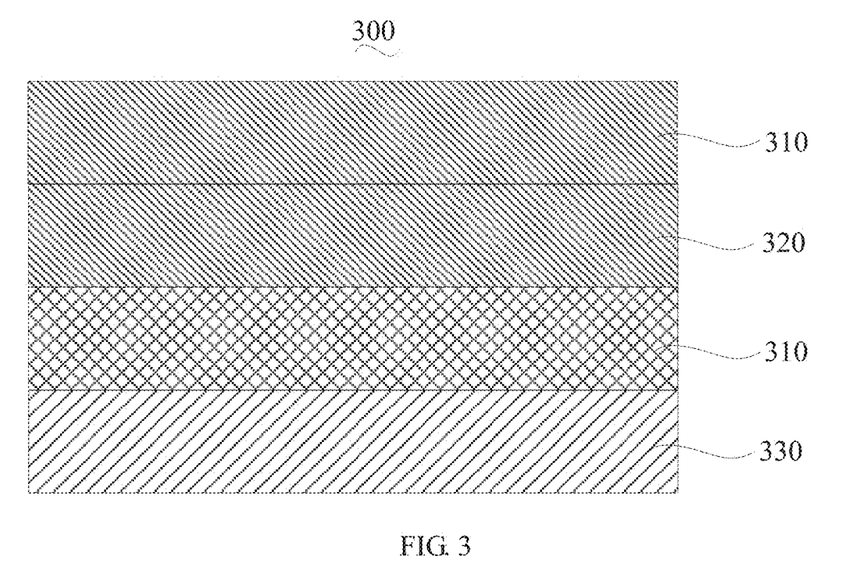
FIG. 3 is a schematic view of a photocatalytic assembly according to another embodiment.

Referring to FIG. 3, a photocatalytic assembly 300 according to another embodiment has similar structure as the photocatalytic assembly 100. The only difference is that, the photocatalytic assembly 300 according to the illustrated embodiment has two metal layers 310. The two metal layers 310 are located on both opposite surfaces of a titanium dioxide layer 320, respectively; one of the metal layers 310 is laminated on a substrate 330. Each of the metal layers 310 has the same structure as the metal layer 124 of the photocatalytic assembly 100.

Since the structure of the photocatalytic assembly 300 according to the illustrated embodiment is similar to that of the photocatalytic assembly 100, the photocatalytic assembly 300 also has the effect of the photocatalytic assembly 100.

Figure 4:
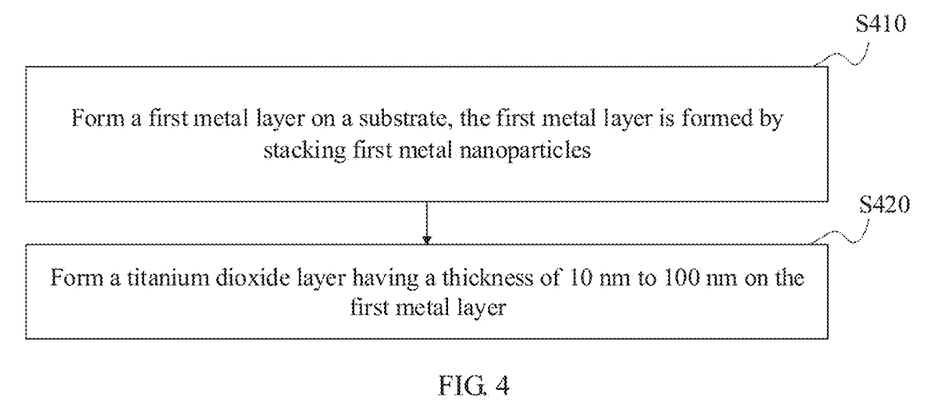
FIG. 4 is a flowchart of a method of preparing a photocatalytic assembly according to another embodiment.

Referring to FIG. 4, a method of preparing a photocatalytic assembly according to one embodiment includes the following steps:

In step S410, a first metal layer is formed on a substrate. The first metal layer is formed by stacking first metal nanoparticles.

Specifically, the first metal layer is formed on the substrate by thermal evaporation, wherein an evaporation rate is 0.4 Å/s to 5 Å/s, and a vacuum degree is $1 \times 10^{-6}$ Pa to $1 \times 10^{-5}$ Pa. The metals can be nucleated at this vacuum degree and evaporation rate to form particles having a specific shape and structure, such that the first metal layer is formed by stacking the first metal nanoparticles. Compared with the chemical synthesis methods, the thermal evaporation has a simpler process and there is no residual chemical composition. In addition, it is possible to achieve the existence of the first metal layer in the form of stacking metal nanoparticles by the thermal evaporation method, and effective control of the particle size of the metal nanoparticle and the structure of the first metal layer can be achieved by the aforementioned parameters. Preferably, the evaporation rate is 1 Å/s.

The supply current during thermal evaporation is 75 A to 200 A.

The substrate is transparent to ultraviolet light. Specifically, the substrate is made of quartz.

The first metal nanoparticle is made of at least one selected from the group consisting of rhodium, palladium, platinum, gold, silver, and aluminum. In addition, the first metal nanoparticle has a particle size less than or equal to 150 nm.

Moreover, the first metal nanoparticle has the particle size of 5 nm to 50 nm. The plasma enhancement effect of the metal nanoparticles with this particle size range is the strongest.

Specifically, the first metal nanoparticle has a spherical structure or a rod-like structure.

In step S420, a titanium dioxide layer having a thickness of 10 nm to 100 nm is formed on the first metal layer.

Specifically, the titanium dioxide layer is formed on the metal layer by atomic layer deposition. The process parameters are specifically: under nitrogen condition, a reaction gas pressure is less than or equal to 0.5 Torr, a temperature of a titanium source is 70° C. to 80° C., a temperature of an oxygen source is 20° C. to 30° C., and a reaction temperature ranges from 150° C. to 250° C. The titanium source and the oxygen source are alternately deposited. During each growth cycle, the titanium source has a deposition time of 0.1 s, the oxygen source has a deposition time of 0.015 s, and an interval ranges from 5 s to 20 s. In other words, each of the growth cycles is as follows: one titanium source deposition is performed and the deposition time thereof is 0.1 s; after the interval of 5 s to 20 s, one oxygen source deposition is performed and the deposition time of the oxygen source deposition is 0.015 s. Preferably, the temperature of the titanium source is 75° C., and the temperature of the oxygen source is 25° C.

Specifically, the titanium source is one selected from the group consisting of tetrakis(dimethylamino)titanium and titanium tetraisopropoxide, and the oxygen source is one selected from the group consisting of water, ozone, and oxygen.

Specifically, a thickness for each of the growth cycle is 0.3 Å to 0.6 Å; preferably 0.5 Å. During the step of forming the titanium dioxide layer having the thickness of 10 nm to 100 nm on the metal layer, the number of cycles of deposition is 200 to 2000 cycles.

In addition, prior to the step of forming the titanium dioxide layer on the first metal layer, the method further includes a step of pulse cleaning the substrate formed with the first metal layer using nitrogen. Under a condition of a gas pressure less than or equal to 0.5 Torr, the substrate formed with the first metal layer is heated to a temperature of 150° C. to 250° C., and a flow rate of nitrogen is controlled at 200 sccm. Each cleaning is performed for 30 s, the cleaning is performed for a plurality of times, and an interval between adjacent two cleanings is 5 s.

Moreover, after the step of pulse cleaning the substrate formed with the first metal layer using nitrogen, and prior to the step of forming the titanium dioxide layer on the first metal layer, the method further includes a step of pulse treating the substrate formed with the first metal layer using tetrakis(dimethylamino)titanium, so as to clean the impurities on the substrate and the first metal layer. The step of pulse treating the substrate formed with the first metal layer using tetrakis(dimethylamino)titanium is: the time for each pulse treatment is 0.5 s, and the pulse treatment is repeated for 5 times. An interval between adjacent two pulse treatments is 5 s, so as to clean the impurities on the substrate and the first metal layer.

Since the current powder titanium dioxide material is usually prepared by a chemical synthesis method, the synthesis method is complex and complicated, with many by-products and poor reproducibility. By using the atomic layer deposition method, the film formation uniformity and shape retention of titanium dioxide are excellent, and the process is easy to control and has good reproducibility.

Furthermore, after the step of forming the titanium dioxide layer on the first metal layer, the method further includes a step of forming a second metal layer on the titanium dioxide layer by evaporation. The second metal layer is formed by stacking second metal nanoparticles, and the second metal nanoparticle is made of at least one selected from the group consisting of platinum, gold, silver, and aluminum. Specifically, the method for preparing the second metal layer is the same as the method for preparing the first metal layer. The only difference is that, the second metal layer is evaporated on the titanium dioxide layer.

Specifically, the second metal nanoparticle has a particle size less than or equal to 150 nm.

In addition, the second metal nanoparticle has the particle size of 5 nm to 50 nm.

Specifically, the second metal nanoparticle has a spherical structure or a rod-like structure.

The aforementioned preparation method is simple to operation and easy to industrial production.

Figure 5:
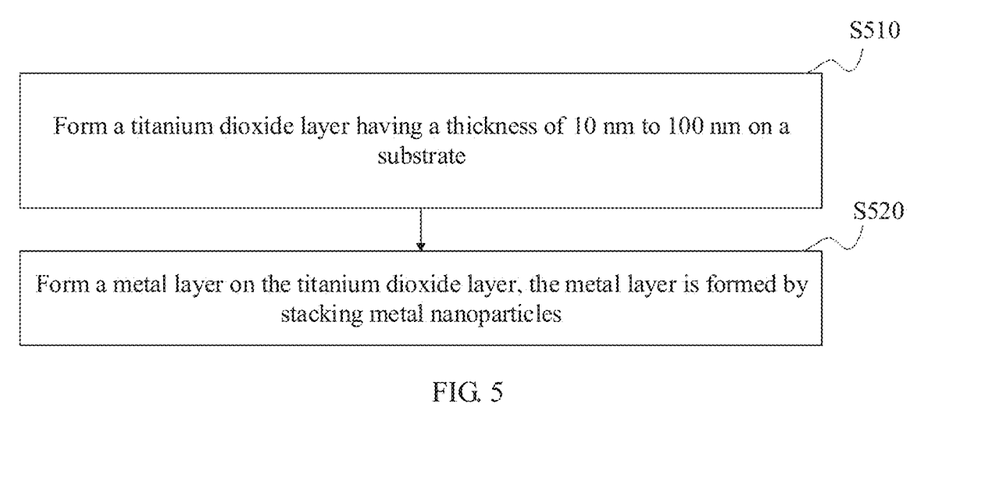
FIG. 5 is a flowchart of a method of preparing a photocatalytic assembly according to another embodiment.

Referring to FIG. 5, a method of preparing a photocatalytic assembly according to another embodiment includes the following steps:

In step S510, a titanium dioxide layer having a thickness of 10 nm to 100 nm is formed on a substrate.

Specifically, the method for forming the titanium dioxide layer on the substrate is substantially the same as the step of forming the titanium dioxide layer on the first metal layer of the step S420. The only difference is that, the titanium dioxide layer is deposited on the substrate directly by the atomic layer deposition method in the step S510.

In step S520: a metal layer is formed on the titanium dioxide layer. The metal layer is formed by stacking metal nanoparticles.

Specifically, the method for forming the metal layer on the titanium dioxide layer is substantially the same as the step of forming the first metal layer on the substrate of the step S410. The only difference is that, the metal layer in the step S520 is evaporated on the titanium dioxide layer by thermal evaporation.

The aforementioned preparation method is simple to operation and easy to industrial production.

The following is examples:

EXAMPLE 1

Figure 6:
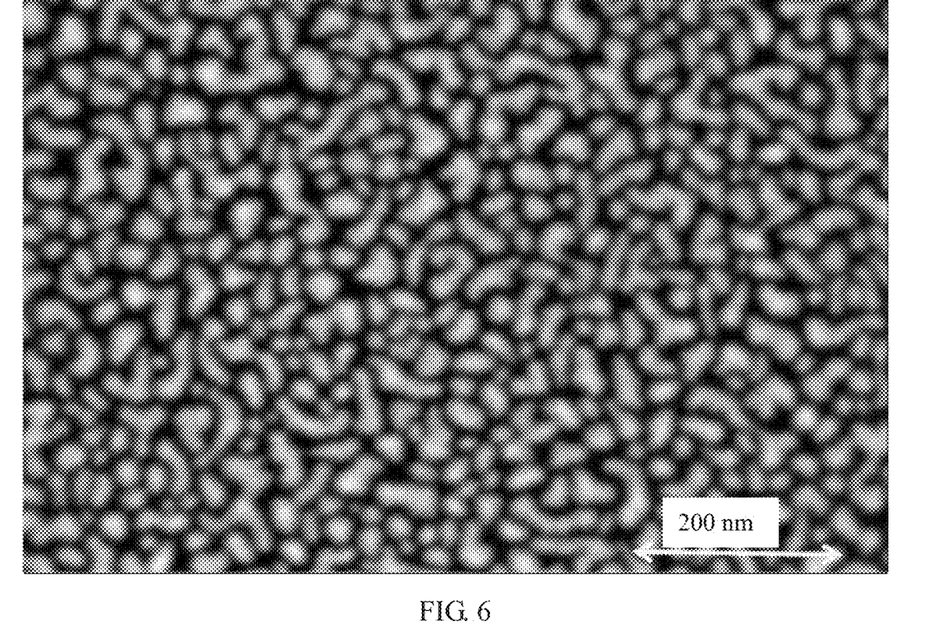
FIG. 6 shows the scanning electron microscope (SEM) diagram of a metal layer according to Example 1 at a magnification of 500,000.

The preparation process of a photocatalytic assembly of the present embodiment is as follows:

(1) Vacuumization was performed to $5\times10^{-6}$ Pa, and a shield of a substrate was closed. A metal film material was put into an evaporation boat and the supply current for heating the evaporation boat was adjusted to 120 A. The counting frequency of a detector was observed. When the counting frequency reached 1 Å/s, the heating current was maintained and the shield of the substrate was opened. An evaporation was started and the value of the detector was recorded. When a thickness of a metal layer on the substrate reached 5 nm, the shield of the substrate was closed and the evaporation boat was turned off. After waiting for 10 min, the vacuum was broken to obtain the substrate formed with the metal layer formed by stacking metal nanoparticles. In addition, the metal nanoparticle had a rod-like structure, and an average particle size of the metal nanoparticle was 15 nm to 30 nm. As shown in FIG. 6, FIG. 6 shows the SEM diagram of the metal layer on the substrate at a magnification of 500,000. As can be seen from FIG. 6, the metal layer was formed by stacking metal nanoparticles, and the metal nanoparticle had the rod-like structure. The substrate was quartz, and the metal film material was a silver block with a purity of 99.999%.

(2) Vacuumization was performed until a pressure was 0.5 Torr. The substrate formed with the metal layer was heated to 200° C., and a flow rate of nitrogen was controlled at 200 sccm. Each cleaning was performed for 30 s, the cleaning was performed for 20 times, and an interval between each of the cleanings was 5 s. Then, the substrate formed with the metal layer was pulse treated using tetrakis(dimethylamino) titanium. The time for each pulse treatment was 0.5 s, and the pulse treatment was repeated for 5 times. An interval between adjacent two pulse treatments was 5 s. Finally, a temperature of a titanium source was controlled to 75° C., and a temperature of an oxygen source was controlled to 25° C. The titanium source and the oxygen source were alternately deposited. During each growth cycle, the titanium source had a deposition time of 0.1 s, the oxygen source had a deposition time of 0.015 s, and an interval was 10 s. A thickness for each of the growth cycle was 0.5 Å. The deposition was performed for 200 cycles. Thus, a titanium dioxide layer having a thickness of 10 nm was formed on the metal layer, cooled to a temperature of 100° C., and taken out. The titanium source was tetrakis(dimethylamino)titanium, and the oxygen source was water.

The photocatalytic assembly of the present embodiment was used as a catalyst, a methyl blue solution was used to simulate organic wastewater, and a xenon lamp was used to simulate sunlight condition, the photocatalytic efficiency of the photocatalytic assembly prepared by the present embodiment was obtained by investigating the photocatalytic degradation process of the methyl blue solution. The method was specifically as follows: a methyl blue solution with a concentration of 1 mg/ml was taken, and then the photocatalytic assembly of the present embodiment was immersed in the methyl blue solution. After still standing for 30 minutes under a dark condition, the concentration of the solution was measured by filtration after being placed in simulated sunlight (model of the simulation lamp was Zolix, Sieius-300P, wavelength was 320 to 2500 nm, and light intensity was 100 mW/cm$^2$) for 30 minutes. The photocatalytic efficiency of the catalytic assembly was reflected by (initial concentration value–the concentration value)/initial concentration value. The photocatalytic efficiency of the photocatalytic assembly of the present embodiment was shown in Table 1.

EXAMPLE 2

Figure 7:
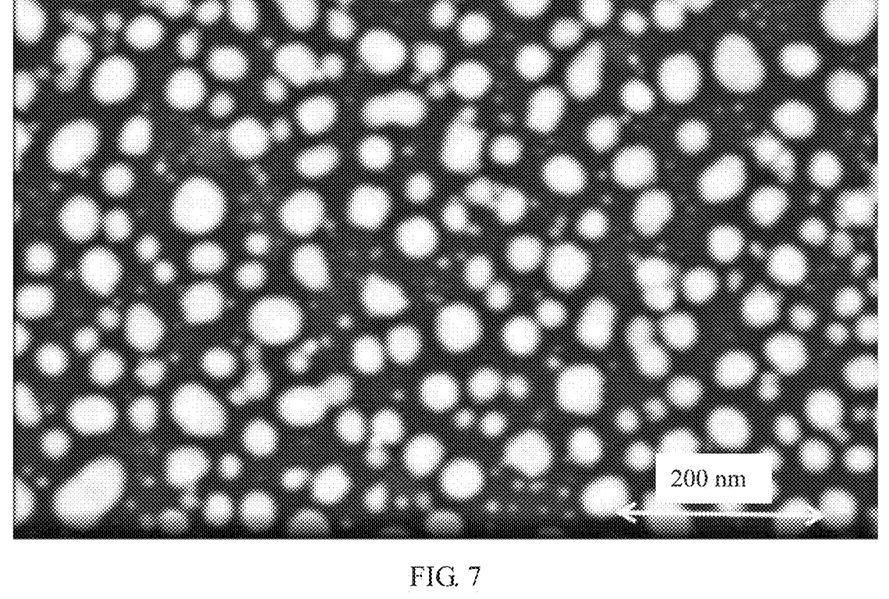
FIG. 7 shows the SEM diagram of a metal layer according to Example 2 at a magnification of 500,000.

The preparation process of a photocatalytic assembly of the present embodiment is as follows:

(1) Vacuumization was performed to 5×10$^{-6}$ Pa, and a shield of a substrate was closed. A metal film material was put into an evaporation boat and the supply current for heating the evaporation boat was adjusted to 120 A. The counting frequency of a detector was observed. When the counting frequency reached 1 Å/s, the heating current was maintained and the shield of the substrate was opened. An evaporation was started and the value of the detector was recorded. When a thickness of a metal layer on the substrate reached 1 nm, the shield of the substrate was closed and the evaporation boat was turned off. After waiting for 10 min, the vacuum was broken to obtain the substrate formed with the metal layer formed by stacking metal nanoparticles. In addition, the metal nanoparticle had a spherical structure, and a particle size of the metal nanoparticle was 5 to 10 nm. As shown in FIG. 7. FIG. 7 shows the SEM diagram of the metal layer on the substrate at a magnification of 500,000. As can be seen from FIG. 7, the metal layer was formed by stacking metal nanoparticles, and the metal nanoparticle had the spherical structure. The substrate was quartz, and the metal film material was a silver block with a purity of 99.999%.

(2) Vacuumization was performed until a pressure was 0.5 Torr. The substrate formed with the metal layer was heated to 250° C., and a flow rate of nitrogen was controlled at 200 sccm. Each cleaning was performed for 30 s, the cleaning was performed for 20 times, and an interval between each of the cleanings was 5 s. Then, the substrate formed with the metal layer was pulse treated using tetrakis(dimethylamino) titanium. The time for each pulse treatment was 0.5 s, and the pulse treatment was repeated for 5 times. An interval between adjacent two pulse treatments was 5 s. Finally, a temperature of a titanium source was controlled to 75° C., and a temperature of an oxygen source was controlled to 25° C. The titanium source and the oxygen source were alternately deposited. During each growth cycle, the titanium source had a deposition time of 0.1 s, the oxygen source had a deposition time of 0.015 s, and an interval was 15 s. A thickness for each of the growth cycle was 0.5 Å. The deposition was performed for 400 cycles. Thus, a titanium dioxide layer having a thickness of 20 nm was formed on the metal layer, cooled to a temperature of 100° C., and taken out. The titanium source was tetrakis(dimethylamino)titanium, and the oxygen source was water.

The photocatalytic efficiency of the photocatalytic assembly of the present embodiment was obtained using the same measurement method as in Example 1, which was shown in Table 1.

EXAMPLE 3

The preparation process of a photocatalytic assembly of the present embodiment is as follows:

(1) Vacuumization was performed to 1×10$^{-5}$ Pa, and a shield of a substrate was closed. A metal film material was put into an evaporation boat and the supply current for heating the evaporation boat was adjusted to 75 A. The counting frequency of a detector was observed. When the counting frequency reached 5 Å/s, the heating current was maintained and the shield of the substrate was opened. An evaporation was started and the value of the detector was recorded. When a thickness of a metal layer on the substrate reached 9 nm, the shield of the substrate was closed and the evaporation boat was turned off. After waiting for 10 min, the vacuum was broken to obtain the substrate formed with the metal layer formed by stacking metal nanoparticles. In addition, the metal nanoparticle had a rod-like structure, and a particle size of the metal nanoparticle was 40 nm to 50 nm. The substrate was quartz, and the metal film material was an aluminum block with a purity of 99.999%.

(2) Vacuumization was performed until a pressure was 0.5 Torr. The substrate formed with the metal layer was heated to 150° C., and a flow rate of nitrogen was controlled at 200 sccm. Each cleaning was performed for 30 s, the cleaning was performed for 20 times, and an interval between each of the cleanings was 5 s. Then, the substrate formed with the metal layer was pulse treated using tetrakis(dimethylamino) titanium. The time for each pulse treatment was 0.5 s, and the pulse treatment was repeated for 5 times. An interval between adjacent two pulse treatments was 5 s. Finally, a temperature of a titanium source was controlled to 70° C., and a temperature of an oxygen source was controlled to 25° C. The titanium source and the oxygen source were alternately deposited. During each growth cycle, the titanium source had a deposition time of 0.1 s, the oxygen source had a deposition time of 0.015 s, and an interval was 20 s. A thickness for each of the growth cycle was 0.5 Å. The deposition was performed for 200 cycles. Thus, a titanium dioxide layer having a thickness of 10 nm was formed on the metal layer, cooled to a temperature of 100° C., and taken out. The titanium source was tetrakis(dimethylamino)titanium, and the oxygen source was water.

The photocatalytic efficiency of the photocatalytic assembly of the present embodiment was obtained using the same measurement method as in Example 1, which was shown in Table 1.

EXAMPLE 4

The preparation process of a photocatalytic assembly of the present embodiment is as follows:

(1) Vacuumization was performed to 1×10$^{-5}$ Pa, and a shield of a substrate was closed. A metal film material was put into an evaporation boat and the supply current for heating the evaporation boat was adjusted to 115 A. The counting frequency of a detector was observed. When the counting frequency reached 0.4 Å/s, the heating current was maintained and the shield of the substrate was opened. An evaporation was started and the value of the detector was recorded. When a thickness of a metal layer on the substrate reached 5 nm, the shield of the substrate was closed and the evaporation boat was turned off. After waiting for 10 min, the vacuum was broken to obtain the substrate formed with the metal layer formed by stacking metal nanoparticles. In addition, the metal nanoparticle had a rod-like structure, and a particle size of the metal nanoparticle was 15 to 30 nm. The substrate was quartz, and the metal film material was a silver block with a purity of 99.999%.

(2) Vacuumization was performed until a pressure was 0.1 Torr. The substrate formed with the metal layer was heated to 150° C., and a flow rate of nitrogen was controlled at 200 sccm. Each cleaning was performed for 30 s, the cleaning was performed for 20 times, and an interval between each of the cleanings was 5 s. Then, the substrate formed with the metal layer was pulse treated using tetrakis(dimethylamino) titanium. The time for each pulse treatment was 0.5 s, and the pulse treatment was repeated for 5 times. An interval between adjacent two pulse treatments was 5 s. Finally, a temperature of a titanium source was controlled to 70° C., and a temperature of an oxygen source was controlled to 20° C. The titanium source and the oxygen source were alternately deposited. During each growth cycle, the titanium source had a deposition time of 0.1 s, the oxygen source had a deposition time of 0.015 s, and an interval was 20 s. A thickness for each of the growth cycle was 0.3 Å. The deposition was performed for 5000 cycles. Thus, a titanium dioxide layer having a thickness of 150 nm was formed on the metal layer, cooled to a temperature of 100° C., and taken out. The titanium source was titanium tetraisopropoxide, and the oxygen source was ozone.

The photocatalytic efficiency of the photocatalytic assembly of the present embodiment was obtained using the same measurement method as in Example 1, which was shown in Table 1.

EXAMPLE 5

The preparation process of a photocatalytic assembly of the present embodiment is as follows:

(1) Vacuumization was performed to $3 \times 10^{-6}$ Pa, and a shield of a substrate was closed. A metal film material was put into an evaporation boat and the supply current for heating the evaporation boat was adjusted to 110 A. The counting frequency of a detector was observed. When the counting frequency reached 1 Å/s, the heating current was maintained and the shield of the substrate was opened. An evaporation was started and the value of the detector was recorded. When a thickness of a metal layer on the substrate reached 5 nm, the shield of the substrate was closed and the evaporation boat was turned off. After waiting for 10 min, the vacuum was broken to obtain the substrate formed with the metal layer formed by stacking metal nanoparticles. In addition, the metal nanoparticle had a rod-like structure, and a particle size of the metal nanoparticle was 15 to 30 nm. The substrate was quartz, and the metal film material was a gold block with a purity of 99.999%.

(2) Vacuumization was performed until a pressure was 0.2 Torr. The substrate formed with the metal layer was heated to 250° C., and a flow rate of nitrogen was controlled at 200 sccm. Each cleaning was performed for 30 s, the cleaning was performed for 20 times, and an interval between each of the cleanings was 5 s. Then, the substrate formed with the metal layer was pulse treated using tetrakis(diethylamino) titanium. The time for each pulse treatment was 0.5 s, and the pulse treatment was repeated for 5 times. An interval between adjacent two pulse treatments was 5 s. Finally, a temperature of a titanium source was controlled to 80° C., and a temperature of an oxygen source was controlled to 30° C. The titanium source and the oxygen source were alternately deposited. During each growth cycle, the titanium source had a deposition time of 0.1 s, the oxygen source had a deposition time of 0.015 s, and an interval was 5 s. A thickness for each of the growth cycle was 0.6 Å. The deposition was performed for 666 cycles. Thus, a titanium dioxide layer having a thickness of 40 nm was formed on the metal layer, cooled to a temperature of 100° C., and taken out. The titanium source was tetrakis(diethylamino)titanium, and the oxygen source was oxygen.

The photocatalytic efficiency of the photocatalytic assembly of the present embodiment was obtained using the same measurement method as in Example 1, which was shown in Table 1.

EXAMPLE 6

The preparation process of the photocatalytic assembly of Example 6 was substantially the same as that of Example 1. The only difference is that, the supply current of the evaporation boat in the step (1) was 200 A, and the metal film material was a platinum block with a purity of 99.999%.

The photocatalytic efficiency of the photocatalytic assembly of the present embodiment was obtained using the same measurement method as in Example 1, which was shown in Table 1.

EXAMPLE 7

The preparation process of the photocatalytic assembly of Example 7 was substantially the same as that of Example 1. The only difference is that, the supply current of the evaporation boat in the step (1) was 190 Å, and the metal film material was a rhodium block with a purity of 99.999%.

The photocatalytic efficiency of the photocatalytic assembly of the present embodiment was obtained using the same measurement method as in Example 1, which was shown in Table 1.

EXAMPLE 8

The preparation process of the photocatalytic assembly of Example 8 was substantially the same as that of Example 1. The only difference is that, the supply current of the evaporation boat in the step (1) was 130 Å, and the metal film material was a palladium block with a purity of 99.999%.

The photocatalytic efficiency of the photocatalytic assembly of the present embodiment was obtained using the same measurement method as in Example 1, which was shown in Table 1.

EXAMPLE 9

The preparation process of a photocatalytic assembly of the present embodiment is as follows:

(1) Vacuumization was performed to $6 \times 10^{-6}$ Pa, and a shield of a substrate was closed. A metal film material was put into an evaporation boat and the supply current for heating the evaporation boat was adjusted to 75 A. The counting frequency of a detector was observed. When the counting frequency reached 1 Å/s, the heating current was maintained and the shield of the substrate was opened. An evaporation was started and the value of the detector was recorded. When a thickness of a first metal layer on the substrate reached 3 nm, the shield of the substrate was closed and the evaporation boat was turned off. After waiting for 10 min, the vacuum was broken to obtain the substrate formed with the first metal layer formed by stacking first metal nanoparticles. In addition, the metal nanoparticle had a spherical structure, and a particle size of the first metal nanoparticle was 5 nm to 15 nm. The substrate was quartz, and the metal film material was an aluminum block with a purity of 99.999%.

(2) Vacuumization was performed until a pressure was 0.4 Torr. The substrate formed with the first metal layer was heated to 250° C., and a flow rate of nitrogen was controlled at 200 sccm. Each cleaning was performed for 30 s, the cleaning was performed for 20 times, and an interval between each of the cleanings was 5 s. Then, the substrate formed with the first metal layer was pulse treated using tetrakis(dimethylamino)titanium. The time for each pulse treatment was 0.5 s, and the pulse treatment was repeated for 5 times. An interval between adjacent two pulse treatments was 5 s. Finally, a temperature of a titanium source was controlled to 75° C., and a temperature of an oxygen source was controlled to 25° C. The titanium source and the oxygen source were alternately deposited. During each growth cycle, the titanium source had a deposition time of 0.1 s, the oxygen source had a deposition time of 0.015 s, and an interval was 5 s. A thickness for each of the growth cycle was 0.5 Å. The deposition was cycled for 300 times. Thus, a titanium dioxide layer having a thickness of 15 nm was formed on the first metal layer, cooled to a temperature of 100° C., and taken out. The titanium source was tetrakis (dimethylamino)titanium, and the oxygen source was water.

(3) Vacuumization was performed again to 6×10$^{-6}$ Pa, and the shield was closed. The metal film material was put into the evaporation boat and the supply current for heating the evaporation boat was adjusted to 75 A. The counting frequency of the detector was observed. When the counting frequency reached 1 Å/s, the heating current was maintained and the shield of the substrate was opened. An evaporation was started and the value of the detector was recorded. When a thickness of a second metal layer on the titanium dioxide layer reached 5 nm, the shield was closed and the evaporation boat was turned off. After waiting for 10 min, the vacuum was broken, the second metal layer formed by stacking second metal nanoparticles was formed on the titanium dioxide layer. In addition, the second metal nanoparticle had a spherical structure, and a particle size of the second metal nanoparticle was 15 nm to 30 nm. The substrate was quartz, and the metal film material was an aluminum block with a purity of 99.999%.

The photocatalytic efficiency of the photocatalytic assembly of the present embodiment was obtained using the same measurement method as in Example 1, which was shown in Table 1.

EXAMPLE 10

The preparation process of a photocatalytic assembly of the present embodiment is as follows:

(1) Vacuumization was performed until a pressure was 0.5 Torr. A substrate was heated to 200° C., and a flow rate of nitrogen was controlled at 200 sccm. Each cleaning was performed for 30 s, the cleaning was performed for 20 times, and an interval between each of the cleanings was 5 s. Then, the substrate formed with a metal layer was pulse treated using tetrakis(dimethylamino)titanium. The time for each pulse treatment was 0.5 s, and the pulse treatment was repeated for 5 times. An interval between adjacent two pulse treatments was 5 s. Finally, a temperature of a titanium source was controlled to 75° C., and a temperature of an oxygen source was controlled to 25° C. The titanium source and the oxygen source were alternately deposited. During each growth cycle, the titanium source had a deposition time of 0.1 s, the oxygen source had a deposition time of 0.015 s, and an interval was 10 s. A thickness for each of the growth cycle was 0.5 Å. The deposition was performed for 200 cycles. Thus, a titanium dioxide layer having a thickness of 10 nm was formed on the substrate, cooled to a temperature of 100° C., and taken out. The titanium source was tetrakis(dimethylamino)titanium, and the oxygen source was water.

(2) Vacuumization was performed to less than or equal to 10$^{-6}$ Pa, and a shield was closed. A metal film material was put into an evaporation boat and the supply current for heating the evaporation boat was adjusted to 110 A. The counting frequency of a detector was observed. When the counting frequency reached 1 Å/s, the heating current was maintained and the shield was opened. An evaporation was started and the value of the detector was recorded. When a thickness of the metal layer on the titanium dioxide layer reached 5 nm, the shield of the substrate was closed and the evaporation boat was turned off After waiting for 10 min, the vacuum was broken, the metal layer formed by stacking metal nanoparticles was formed on the titanium dioxide layer. In addition, the metal nanoparticle had a spherical structure, and an average particle size of the metal nanoparticle was about 15 nm to 30 nm. The substrate was quartz, and the metal film material was a gold block with a purity of 99.999%.

The photocatalytic efficiency of the photocatalytic assembly of the present embodiment was obtained using the same measurement method as in Example 1, which was shown in Table 1.

EXAMPLE 11

The preparation process of a photocatalytic assembly of the present embodiment is as follows:

(1) Vacuumization was performed until a pressure was 0.5 Torr. A substrate was heated to 200° C., and a flow rate of nitrogen was controlled at 200 sccm. Each cleaning was performed for 30 s, the cleaning was performed for 20 times, and an interval between each of the cleanings was 5 s. Then, the substrate formed with a metal layer was pulse treated using tetrakis(dimethylamino)titanium. The time for each pulse treatment was 0.5 s, and the pulse treatment was repeated for 5 times. An interval between adjacent two pulse treatments was 5 s. Finally, a temperature of a titanium source was controlled to 75° C., and a temperature of an oxygen source was controlled to 25° C. The titanium source and the oxygen source were alternately deposited. During each growth cycle, the titanium source had a deposition time of 0.1 s, the oxygen source had a deposition time of 0.015 s, and an interval was 10 s. A thickness for each of the growth cycle was 0.5 Å. The total time of the deposition was 80 min. Thus, a titanium dioxide layer having a thickness of 10 nm was formed on the substrate, cooled to a temperature of 100° C., and taken out. The titanium source was tetrakis (dimethylamino)titanium, and the oxygen source was water.

(2) Vacuumization was performed to less than or equal to 10$^{-6}$ Pa, and a shield was closed. A metal film material was put into an evaporation boat and the supply current for heating the evaporation boat was adjusted to 200 A. The counting frequency of a detector was observed. When the counting frequency reached 1 Å/s, the heating current was maintained and the shield was opened. An evaporation was started and the value of the detector was recorded. When a thickness of the metal layer on the titanium dioxide layer reached 20 nm, the shield of the substrate was closed and the evaporation boat was turned off. After waiting for 10 min, the vacuum was broken, the metal layer formed by stacking metal nanoparticles was formed on the titanium dioxide layer. In addition, the metal nanoparticle had a rod-like structure, and an average particle size of the metal nanoparticle was about 100 nm to 150 nm. The substrate was quartz, and the metal film material was a platinum block with a purity of 99.999%.

The photocatalytic efficiency of the photocatalytic assembly of the present embodiment was obtained using the same measurement method as in Example 1, which was shown in Table 1.

COMPARATIVE EXAMPLE 1

The photocatalytic assembly of Comparative Example 1 was titanium dioxide P25 from Evonik Industries Company. Titanium dioxide was coated on the same substrate as in Example 1 by a spin coating method, and the titanium dioxide film of the photocatalytic assembly of the comparative example had a thickness of 10 nm.

The photocatalytic efficiency of the photocatalytic assembly of the Comparative Example 1 was obtained using the same measurement method as in Example 1, which was shown in Table 1.

COMPARATIVE EXAMPLE 2

The preparation process of a photocatalytic assembly of the Comparative Example 2 is as follows:

Vacuumization was performed until a pressure was 0.5 Torr. A substrate was heated to 200° C., and a flow rate of nitrogen was controlled at 200 sccm. Each cleaning was performed for 30 s, the cleaning was performed for 20 times, and an interval between each of the cleanings was 5 s. Then, the substrate formed with a metal layer was pulse treated using tetrakis(dimethylamino)titanium. The time for each pulse treatment was 0.5 s, and the pulse treatment was repeated for 5 times. An interval between adjacent two pulse treatments was 5 s. Finally, a temperature of a titanium source was controlled to 75° C., and a temperature of an oxygen source was controlled to 25° C. The titanium source and the oxygen source were alternately deposited. During each growth cycle, the titanium source had a deposition time of 0.1 s, the oxygen source had a deposition time of 0.015 s, and an interval was 20 s. A thickness for each of the growth cycle was 0.5 Å. The deposition was performed for 200 cycles. Thus, a titanium dioxide layer having a thickness of 10 nm was formed on the substrate, cooled to a temperature of 100° C., and taken out. The titanium source was tetrakis(dimethylamino)titanium, and the oxygen source was water.

The photocatalytic efficiency of the photocatalytic assembly of the Comparative Example 2 was obtained using the same measurement method as in Example 1, which was shown in Table 1.

COMPARATIVE EXAMPLE 3

Figure 8:
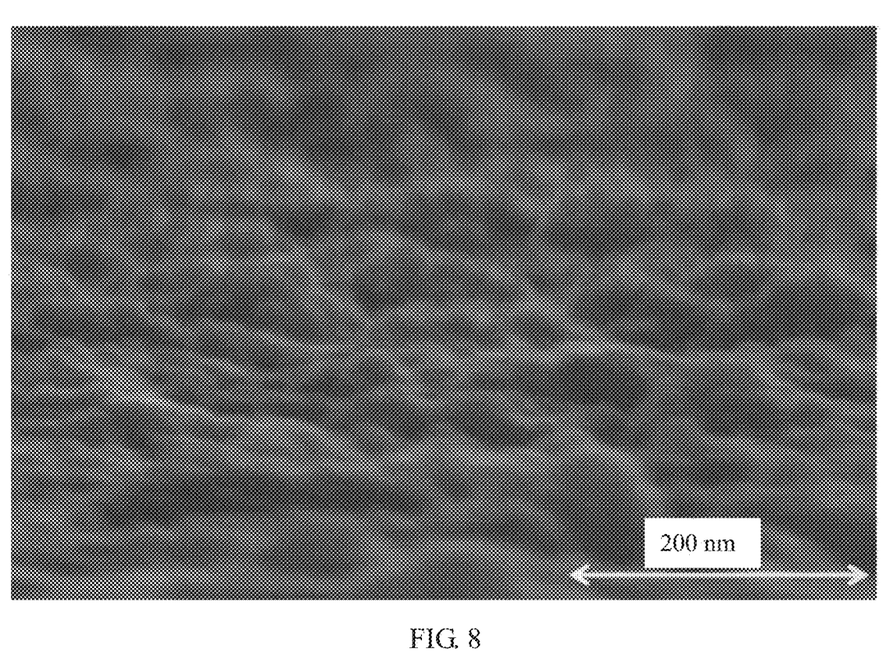
FIG. 8 shows the SEM diagram of a metal layer according to Comparative Example 3 at a magnification of 500,000.

The preparation process of a photocatalytic assembly of the comparative example is as follows:

(1) Vacuumization was performed to 5×10⁻⁶ Pa, and a shield of a substrate was closed. A metal film material was put into an evaporation boat and the supply current for heating the evaporation boat was adjusted to 120 A. The counting frequency of a detector was observed. When the counting frequency reached 1 Å/s, the heating current was maintained and the shield of the substrate was opened. An evaporation was started and the value of the detector was recorded. When a thickness of a metal layer on the substrate reached 35 nm, the shield of the substrate was closed and the evaporation boat was turned off. After waiting for 10 min, the vacuum was broken to obtain the substrate formed with the metal layer. FIG. 8 shows the SEM diagram of the metal layer on the substrate at a magnification of 500,000. As can be seen from FIG. 8, the metal layer was a silver metal film, the substrate was quartz, and the metal film material was a silver block with a purity of 99.999%.

(2) Vacuumization was performed until a pressure was 0.5 Torr. The substrate formed with the metal layer was heated to 200° C., and a flow rate of nitrogen was controlled at 200 sccm. Each cleaning was performed for 30 s, the cleaning was performed for 20 times, and an interval between each of the cleanings was 5 s. Then, the substrate formed with the metal layer was pulse treated using tetrakis(dimethylamino)titanium. The time for each pulse treatment was 0.5 s, and the pulse treatment was repeated for 5 times. An interval between adjacent two pulse treatments was 5 s. Finally, a temperature of a titanium source was controlled to 75° C., and a temperature of an oxygen source was controlled to 25° C. The titanium source and the oxygen source were alternately deposited. During each growth cycle, the titanium source had a deposition time of 0.1 s, the oxygen source had a deposition time of 0.015 s, and an interval was 10 s. A thickness for each of the growth cycle was 0.5 Å. The deposition was performed for 200 cycles. Thus, a titanium dioxide layer having a thickness of 10 nm was formed on the metal layer, cooled to a temperature of 100° C., and taken out. The titanium source was tetrakis(dimethylamino)titanium, and the oxygen source was water.

The photocatalytic efficiency of the photocatalytic assembly of the Comparative Example 3 was obtained using the same measurement method as in Example 1, which was shown in Table 1.

Table 1 shows the photocatalytic efficiencies of photocatalytic assemblies of Examples 1 to 11 and Comparative Examples 1 to 3.

TABLE 1

|  | Photocatalytic efficiency |
|---|---|
| Example 1 | 70% |
| Example 2 | 60% |
| Example 3 | 65% |
| Example 4 | 300% |
| Example 5 | 200% |
| Example 6 | 90% |
| Example 7 | 95% |
| Example 8 | 85% |
| Example 9 | 50% |
| Example 10 | 150% |
| Example 11 | 75% |
| Comparative Example 1 | 36% |
| Comparative Example 2 | 11% |
| Comparative Example 3 | 20% |

As can be seen from Table 1, the photocatalytic efficiencies of the photocatalytic assemblies of Examples 1 to 11 was at least 60%, while the photocatalytic efficiencies of the photocatalytic assemblies of Comparative Examples 1 and 2 were 36% and 11%, respectively, which were much lower than the photocatalytic efficiencies of the photocatalytic assemblies of Examples 1 to 11. In addition, the photocatalytic efficiency of the photocatalytic assembly of Example 1 having a thickness of titanium dioxide equal to that of the photocatalytic assembly of Comparative Example 2 was as high as 70%, which was much higher than that of Comparative Example 2.

In general, the greater the thickness of the titanium dioxide layer, the better the catalytic effect. However, although the thickness of the titanium dioxide layer of the photocatalytic assembly of Comparative Example 3 was much greater than that of Example 1, due to the difference in the structures of the metal layers of the photocatalytic assemblies of Example 1 and Comparative Example 3, the photocatalytic assembly of Example 1 had much higher photocatalytic efficiency than that of the photocatalytic assembly of Comparative Example 3.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. A photocatalytic assembly, comprising a substrate, a titanium dioxide layer, and a metal layer comprising discrete, stacked metal nanoparticles, wherein the titanium dioxide layer or the metal layer is laminated on the substrate; wherein the titanium dioxide layer has a thickness of 10 nm to 100 nm, the metal layer is formed by stacking discrete metal nanoparticles, the discrete, metal nanoparticles are made of at least one selected from the group consisting of rhodium, palladium, platinum, gold, silver, and aluminum; wherein each of the discrete, metal nanoparticles has a particle size less than or equal to 150 nm, and wherein the metal layer is formed by thermal evaporation at an evaporation rate of 0.4 Å/s to 5 Å/s, and a vacuum degree of $1\times10^{-6}$ Pa to $1\times10^{-5}$ Pa, wherein each of the discrete, metal nanoparticles has a spherical structure or a rod-like structure, and the titanium dioxide layer is formed by atomic layer deposition.

2. The photocatalytic assembly according to claim 1, wherein the discrete, metal nanoparticle has the particle size of 5 nm to 50 nm.

3. The photocatalytic assembly according to claim 1, wherein the metal layer is laminated on the substrate, and the titanium dioxide layer is laminated on the metal layer.

4. The photocatalytic assembly according to claim 1, wherein the titanium dioxide layer is laminated on the substrate, and the metal layer is laminated on the titanium dioxide layer.

5. The photocatalytic assembly according to claim 1, wherein the metal layer is a first metal layer positioned between the titanium dioxide layer and the substrate, and further comprising a second metal layer located on an opposite side of the titanium dioxide layer that the first metal layer is located.

* * * * *